US005973259A

United States Patent [19]

Edelson

[11] Patent Number: 5,973,259

[45] Date of Patent: Oct. 26, 1999

1

[54] METHOD AND APPARATUS FOR PHOTOELECTRIC GENERATION OF ELECTRICITY

[76] Inventor: Jonathan Sidney Edelson, 23545 NW. Skyline Blvd., Hillsboro, Oreg. 97124-9204

[21] Appl. No.: 08/854,302

[22] Filed: May 12, 1997

[51] Int. Cl.[6] .......... H01L 31/00

[52] U.S. Cl. .......... 136/254

[58] Field of Search .......... 136/254

[56] References Cited

U.S. PATENT DOCUMENTS

| | | | |
|---|---|---|---|
| 2,780,765 | 2/1957 | Chapin . | |
| 3,300,660 | 1/1967 | Bensimon . | |
| 4,108,564 | 8/1978 | Klimin et al. | 313/94 |
| 4,168,716 | 9/1979 | Fowler . | |
| 4,188,571 | 2/1980 | Brunson . | |
| 4,266,179 | 5/1981 | Hamm, Jr. . | |
| 4,405,879 | 9/1983 | Ataka . | |
| 4,528,417 | 7/1985 | Chubb | 136/253 |
| 4,554,478 | 11/1985 | Shimomoto . | |
| 4,694,116 | 9/1987 | Hayashi . | |
| 4,725,758 | 2/1988 | Iigami . | |
| 5,028,835 | 7/1991 | Fitzpatrick . | |
| 5,598,062 | 1/1997 | Iigami . | |

*Primary Examiner*—Mark Chapman

[57] ABSTRACT

A close spaced planar vacuum diode is constructed with a photoemissive first electrode and a low work function second electrode. As a result of photon flux on said photoemissive first electrode, electrons are emitted into the vacuum space and travel to said second electrode. This electron current may then flow through an external load, powering said external load.

21 Claims, 10 Drawing Sheets

METHOD AND APPARATUS FOR PHOTOELECTRIC GENERATION OF ELECTRICITY

BACKGROUND

Field of Invention

This invention relates to the generation of electricity using photoemission and photoemission-thermionic hybrid generators.

Photovoltaic Solar Cells

The first practical solar cell was developed at Bell Laboratories in 1954 (U.S. Pat. No. 2,780,765). With the advent of the space program, photovoltaic cells made from semiconductor-grade silicon quickly became the power source of choice for use on satellites. Disruption of oil supplies to the industrialized world in the early 1970's led to serious consideration of photovoltaic cells as a terrestrial power source, focusing research attention on improving performance, lowering costs and increasing reliability. These three issues remain important today even though researchers have made extraordinary progress over the years.

For photovoltaic cells to be widely used, the costs must be competitive with those of conventional forms of electricity, which are typically 6–7 cents per kilowatt-hour. The US Department of Energy chose a target of 6 cents per kilowatt-hour for its terrestrial photovoltaic program (National Renewable Energy Laboratory. Photovoltaics Program Plan, FY 1991–FY 1995 (1991) National Photovoltaics Program, U.S. Dept. of Energy, Washington, D.C.). Today photovoltaics generate electricity at 20–30 cents per kilowatt hour; an improvement by a factor of five is therefore needed to compete in the bulk electricity market. A number of components influence photovoltaic energy costs. Foremost are the module efficiency, cost per unit area, and lifetime.

The maximum theoretical efficiency for a variety of semiconductor materials can be calculated and is in the 30–35% range, depending on the material. The highest-efficiency single-junction solar cells are made from crystalline silicon and GaAs. Silicon cells of 23% efficiency and GaAs cells of 25% efficiency have been reported. The efficiency of polycrystalline silicon is approximately 18%. A feature of photovoltaic cells is the need to draw current by way of metal contacts distributed over the negative and positive faces of the cell. This creates a problem for cell efficiencies because the contacts create an area that shades the semiconductor material. One approach to avoiding this problem is to use electrodes formed on transparent surfaces. For example, in U.S. Pat. No. 4,694,116 to Yutaki et al., entitled "Thin-Film Solar Cell", a thin-film solar cell is described which has a two-layered transparent electrode formed on a transparent substrate, a photoelectric conversion section formed on the transparent electrode, and a back electrode formed on the photoelectric conversion section. The photoelectric conversion section is generally constituted as a P/N junction. This device has efficiencies in the 7–9% range, depending on the manner of fabrication. Cells made using the edge-defined film-fed growth-ribbon process are reported to have efficiencies of 14% and the figure for dendritic web cells is 15.5%. The highest thin-film cell efficiency reported is 15.8%, for cadmium telluride. Thin films of silicon on ceramic substrates have yielded efficiencies of 15.7%.

In terms of cost, the cheapest material is silicon. There are three major types of silicon solar cells. The first type uses amorphous silicon. These cells do not possess a regular crystal structure. They can be produced in films of 0.3 microns and their production is relatively simple and cheap. Mass production of these cells is quite easy, with small amounts of material being deposited on to a substrate such as glass or aluminum, and can even be made flexible. Their major drawback is their low efficiency and short life-span. Presently, efficiencies are only 5–7%, however this drops to 3–4% in operation due to amorphous silicon instabilities. It is generally used for small scale applications such as calculators and watches.

The second type uses poly-crystalline silicon. These cells consist of a number of silicon crystals grown as an ingot from which wafers are cut. Their maximum efficiency is generally 15% and is standard material for high output applications. These wafers are of the order of 250–400 microns thick.

The final type uses mono-crystalline silicon. These are the highest efficiency silicon cells available and are cut from carefully grown ingots consisting of one crystal only. However in the past their expense has generally precluded them from anything except "space" applications where mass and area limitations are important. Recent developments in mono-crystalline cell technology has seen their cost reduced to around that of the poly-crystalline cell.

An important criterion is therefore cost per watt capacity, which is a compound of the cost per unit area and efficiency. For example crystalline silicon devices cost about 3.5$/W peak and have an efficiency of about 13%. This means that such devices will cost around 450$/m$^2$. On the other hand, amorphous silicon devices, with efficiencies around 5% cost about 2.5$/W peak, or about 125$/m$^2$. So a 10 m$^2$ array will generate 1.3 kW peak for the crystalline silicon device and 0.5 kW peak for the amorphous silicon device, and they will cost $4500 and $1250 respectively. The low efficiency device is thus more economical.

Cells other than silicon are available and use materials with band-gaps nearer to 1.5 eV, such as GaAs and CdTe. They have higher theoretical efficiencies because their particular band-gap energies are closer to the theoretical optimum than silicon, which has a band-gap of 1.12 eV. They do however use materials which are more expensive, less abundant, and can be environmentally hazardous.

Efficiencies are increased as the light intensity is increased, and photovoltaic cells may be used in concentrator systems where the sun's radiation is focused onto the device using a reflector. This advantage is offset by the need to provide a cooling system, because performance and stability degrade at high temperatures.

There remains a need therefore for devices which are inexpensive to produce, and which exhibit stable operation at elevated temperatures in concentrator applications.

Photocells

These devices comprise a photocathode and an anode. The anode is small, often no more than a wire. It is maintained at a positive potential to attract electrons emitted from the cathode. When light impinges on the photocathode, electrons are released which move to the anode. This flow of electrons effectively reduces the resistance of the device, allowing a current to flow in the external biasing circuit. The magnitude of the current is dependent on the intensity of the incident light. These devices do not generate electricity.

Thermionic and Photoelectric Cells

In U.S. Pat. No. 4,266,179 entitled Solar Energy Concentration System", Hamm teaches that if solar energy is used as the heat source for a thermionic converter, it needs to be concentrated so that the temperature at the thermionic converter exceeds 2,800° K. He goes on to describe multiple reflector units that are able to vary the energy concentration at the transducer by 20,000 to 250,000 fold. When this system is used with the "Radiant Energy to Electrical Power Conversion System" described by Brunson in U.S. Pat. No. 4,188,571 an output of 1.38 kW is projected from a device having electrodes separated by 6.3 $\mu$m and a cathode temperature of 3630 Kelvin. Both of these inventions teach that thermionic converters may be used to harness solar energy only if a concentrator is used: they do not teach that thermionic solar energy conversion may be achieved at ambient temperatures. Furthermore, such devices operate by the conversion of light energy to heat, thence the conversion of heat to electricity. They do not teach the direct use of photon energy.

U.S. Pat. No. 4,168,716 to Fowler and Israel, entitled "Solar-Powered Thermionic-Photoelectric Laser", describes a solar-powered thermionic-photoelectric current generator which employs a parabolic telescope for collecting and concentrating sunlight into a narrow beam which is incident upon a thorium-doped tungsten cathode target within an evacuated envelope. This invention uses both thermionic and photoelectric emission from a target to enhance the current generating capabilities of a physical system which might utilize either effect alone. The device is designed so that the space charge of electrons is continuously swept away from the target by the radiation pressure of the light incident upon the target at very large angles of incidence. This invention does not use close spaced electrodes; rather it relies on the radiation pressure of the light to overcome space charge effects. Again this invention teaches that a solar energy concentrator is required in order to use a thermionic-photoelectric generator for harnessing solar energy. This invention also teaches that photoelectric emission is an ancillary source of electrons. The invention does not teach that photoelectric emission is sufficient of itself for the efficient generation of electricity.

Another invention using light to improve the efficiency of thermionic converters is U.S. Pat. No. 3,300,660 to Bensimon, entitled "Thermionic Energy Converter with Photon Ionization". Bensimon describes a device having a capillary emitter, the channels of which permit the penetration of light energy from an external source in order to facilitate the ionization of the atoms of an ionizable material, such as cesium, employed to overcome space charge effects. In this invention, photoelectric emission is not a contributing factor.

It is clear from the above that the art does not teach that pure photoelectric emission can be used for power generation. Where photocathodes have been described, they are for instrument use. For example in U.S. Pat. No. 5,598,062 to Iigami, entitled "Transparent Photocathode" a transparent photocathode is described which composed of a silver layer formed on a transparent substrate, comprising silver particles having an average diameter of 80 to 200 nm, and a silver oxide layer, potassium layer, and a cesium layer. As a result of the silver layer comprising silver particles having dispersive diameters, the transparent photocathode can selectively achieve high sensitivity to an infra-red region of near 1500 nm, and may be thus used in an infra-red analyzer. Although the photocathode is transparent, this invention does not teach that this is an advantage for use in harnessing solar energy for the use of electricity. Indeed, these devices are used for light detection, and as such consume power.

Another invention using a transparent electrode, this time a transparent collector or anode, is described in U.S. Pat. No. 5,028,835 to Fitzpatrick, entitled "Thermionic Energy Production". This invention describes a thermionic device having transparent collector surfaces coated with a thin film of conductive material. This arrangement reduces the conduction of heat by radiation from the hot emitter, thereby increasing the efficiency of the device. It is not taught that the transparent collector directly aids in the generation of electricity from solar energy.

Thus it can be seen from the foregoing that the use of the photoelectric effect to harness solar energy for electricity generation is known only as an adjunct to thermionic emission.

Generation of electricity from solar energy using a device relying on the photoelectric effect alone is not known to the art.

It can also be seen that previous devices using thermionic emission for electricity generation have required the use of solar concentrators to generate high temperatures.

BRIEF DESCRIPTION OF THE INVENTION

The present invention discloses a Photoelectric Generator having close spaced electrodes separated by a vacuum. Photons impinging on the emitter cause electrons to be emitted as a consequence of the photoelectric effect. These electrons move to the collector as a result of excess energy from the photon: part of the photon energy is used escaping from the metal and the remainder is conserved as kinetic energy moving the electron. This means that the lower the work function of the emitter, the lower the energy required by the photons to cause electron emission. A greater proportion of photons will therefore cause photo-emission and the electron current will be higher. The collector work function governs how much of this energy is dissipated as heat: up to a point, the lower the collector work function, the more efficient the device. However there is a minimum value for the collector work function: thermionic emission from the collector will become a problem at elevated temperatures if the collector work function is too low.

Collected electrons return via an external circuit to the cathode, thereby powering a load. One or both of the electrodes are formed as a thin film on a transparent material, which permits light to enter the device. A solar concentrator is not required, and the device operates efficiently at ambient temperature.

The invention further discloses a Photoelectric Generator which is constructed using microengineering techniques.

The present invention further utilizes, in one embodiment, micromachining techniques to construct a Photoelectric Generator.

The present invention further utilizes, in another embodiment, microengineering techniques to construct a Photoelectric Generator by wafer bonding.

The present invention further utilizes, in another embodiment, micromachining techniques to construct a Photoelectric Generator by wafer bonding.

The present invention also discloses a hybrid Photoelectric-Thermionic Generator, in which the emission of electrons by the photoelectric effect is supplemented by the emission of electrons by the thermionic effect. This latter contribution will increase as the device is heated by the incident light.

The present invention differs from the closest known prior art of Fowler and Israel in that it has close-spaced electrodes, does not use a solar concentrating device, is able to generate electricity at ambient temperatures and, in one embodiment, is manufactured using micromachining techniques.

OBJECTS AND ADVANTAGES

An object of the present invention is to provide a photoelectric generator having close-spaced electrodes.

An advantage of the present invention is that space charge effects are reduced and efficiency is increased.

Another object of the present invention is to provide a photoelectric generator having an emitter comprised of a material having a work function of less than about 1.7 eV.

An advantage of the present invention is that the emitter emits electrons at wavelengths of light of 700 nm or less.

A further advantage of the present invention is that the device may be used to convert solar energy to electricity.

A further object of the present invention is to provide a photoelectric generator manufactured by micro-machining means.

An advantage of the present invention is that the photoelectric generator may be mass-produced reliably and economically.

Yet another object of the present invention is to provide a hybrid thermionic-photoelectric generator.

An advantage of the present invention is that heating of the device by solar radiation leads to an increase in electron emission as a result of the thermionic effect.

Another advantage of the present invention is that the device is not damaged by increases in operating temperatures.

REFERENCE NUMERALS IN THE DRAWINGS

21. Emitter
22. Collector
23. Transparent Collector
24. Perforated Collector
31. Transparent Substrate
32. Substrate
41. Conductive Area
42. Electrical Load
51. Incident Light Beam
61. Transparent Casing
62. Evacuated Inter-Electrode Space
71. Silver coating
101. Glass wafer
103. Depression
104. Edge region
105. Saw cut
106. Tab
108. Tungsten alloy
109. Thoriated tungsten
110. Saw cuts
111. Solder bar
112. Main heat conduction pathway
113. Waste heat conduction pathway
114. Photoelectric converter cells
115. Tabs on lower part of cell
116. Tabs on upper part of cell
201. Glass wafer

DESCRIPTION OF THE DRAWINGS

FIGS. 6–10A, 10B illustrate a single embodiment of the present invention and shows in a schematic fashion the fabrication of a photoelectric device which uses a combination of micromachining and wafer bonding techniques.

DETAILED DESCRIPTION OF THE INVENTION

The following description describes preferred embodiments of the invention and should not be taken as limiting the invention.

Figure 1:
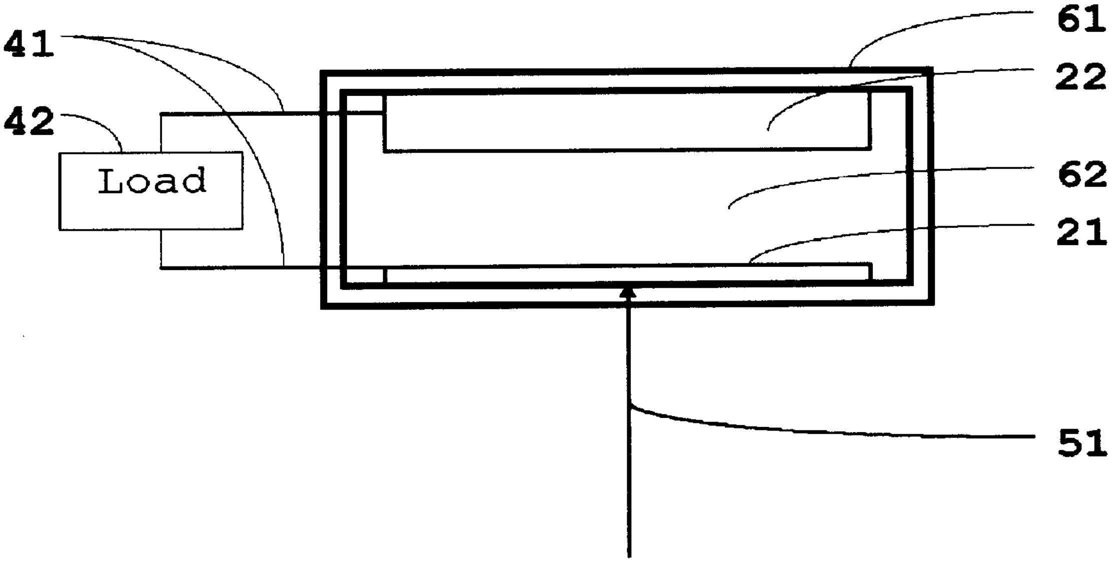
FIGS. 1–5 are schematic representations of various embodiments of a photoelectric generator cell.

With reference to FIG. 1, an emitter 21 is formed on a transparent substrate 61, which is also a casing for the device. Emitter 21 is a thin film of a photoelectric emitter having a work function of 1.8 eV or less, for example, bariated or thoriated tungsten. This value for work function is an example value which allows for copious emission of electrons with sufficient kinetic energy to reach the collector given the sunlight at the earth's surface. These electrons move to the collector as a result of excess energy from the incident photons: part of the photon energy is used escaping from the metal and the remainder is conserved as kinetic energy moving the electron. This means that the lower the work function of the emitter, the lower the energy required by the photons to cause electron emission. A greater proportion of photons will therefore cause photo-emission and the electron current will be higher. The transparent substrate 61 allows a light 51 to impinge on the emitter. Electrons emitted as a consequence of the photoelectric effect move to a collector 22 which is separated from the emitter 21 by an evacuated interelectrode space 62, of the order of 1 $\mu$m. The collector has a work function preferably lower than that of the emitter. The device has a conductive area 41 which allows electrons to flow from the collector 22, through an electrical load 42, and back to the emitter 25.

Figure 2:
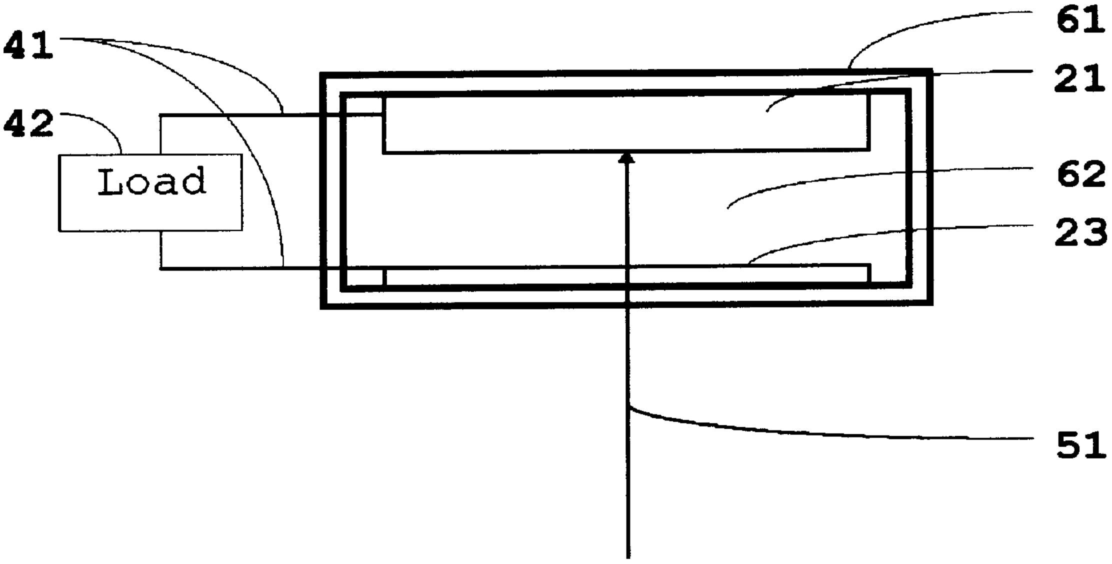

Referring now to FIG. 2, another embodiment of the device has an emitter 21 having a work function of 1.8 eV or less, for example, bariated or thoriated tungsten. A transparent collector 23 is separated from the emitter 21 by an evacuated interelectrode space 62, of the order of 1 $\mu$m. The collector 23 is a thin film formed on a transparent substrate 61 and is sufficiently thin (1 to 300 nm) to allow light to pass through, or is patterned in such a way that light may pass through the interstices of the pattern. Substrate 61 is also a casing for the device. Light 51 enters the device through substrate 61, passes through collector 23 and impinges on emitter 21. Electrons are emitted as a consequence of the photoelectric effect and move to the collector. The device has a conductive area 41 which allows electrons to flow from the collector 23, through an electrical load 42, and back to the emitter 21.

Figure 3:
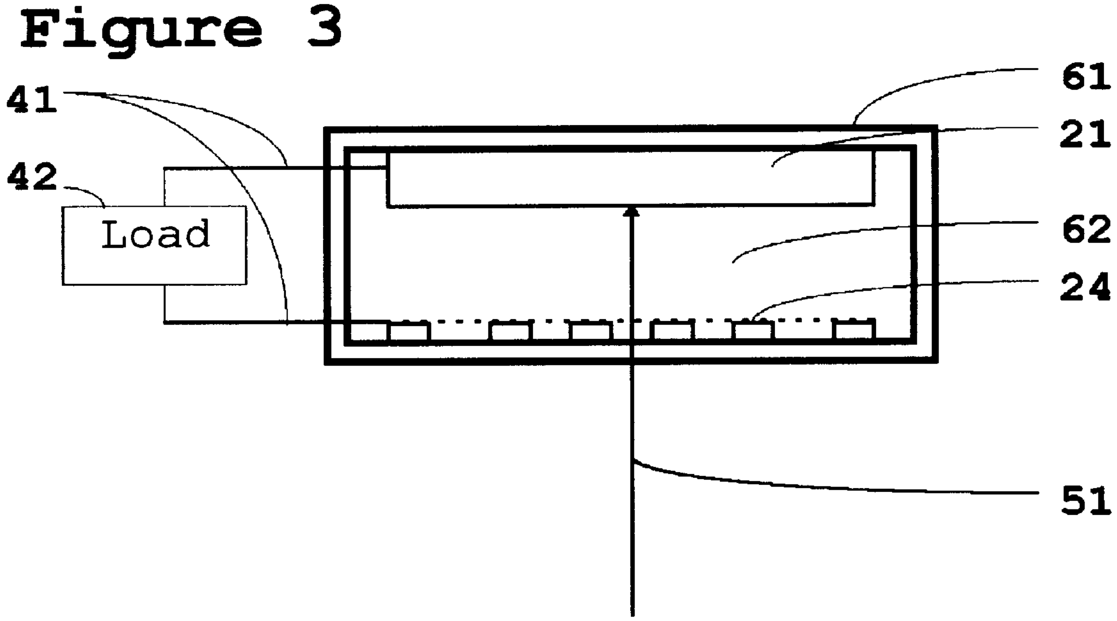

Referring now to FIG. 3, an emitter 21 having a work function of 1.8 eV or less, for example, bariated or thoriated tungsten. A perforated collector 24 is separated from the emitter 21 by an evacuated interelectrode space 62, of the order of 1 $\mu$m. The collector has a number of holes in it which allow light 51 to enter and impinge on the emitter 21. Electrons are emitted as a consequence of the photoelectric effect and move to the collector, which has a work function preferably higher than that of the emitter to limit photoelectric emission at the collector. The device has a conductive area 41 which allows electrons to flow from the collector 24, through an electrical load 42, and back to the emitter 21. The device is housed in a transparent casing 61.

Figure 4:
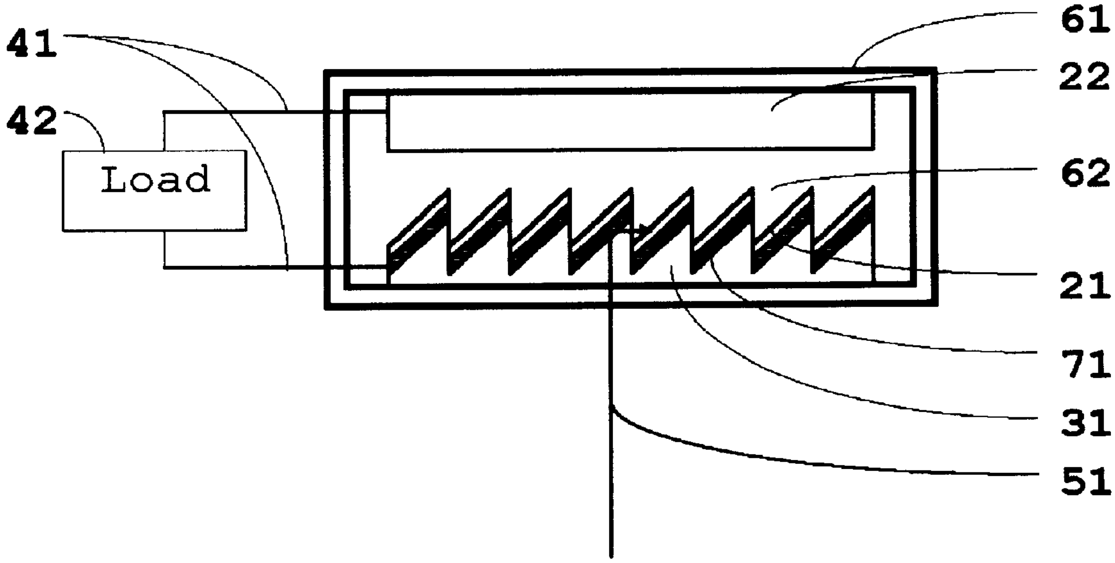

In a still further embodiment (FIG. 4), an emitter 21 is formed on the surface of a transparent substrate 31 having a saw-tooth profile. The surfaces of the substrate inclined at 45 degrees to the incident light 51 may be first coated with a thin layer of a conductive, reflective material 71, such as silver, aluminum or potassium, followed by a thin film of a photoelectric emitter having a work function of 1.8 eV or less, for example, bariated or thoriated tungsten to form an emitter 21, as shown in FIG. 4. Alternatively, the emitter 21 is coated directly onto the surfaces of the substrate inclined at 45 degrees to the incident light 51, and is a thin film of a reflective photoelectric emitter having a work function of 1.8 eV or less, for example, bariated or thoriated tungsten. Light 51 enters through the transparent casing 61 and transparent substrate 31 and is reflected either by the reflective coating 71 as shown in FIG. 4, or is reflected by the underside of emitter 21, through the transparent vertical wall of casing 61 onto the adjacent surface of the emitter. Electrons are emitted as a consequence of the photoelectric effect and move to a collector 22 which is separated from the emitter 21 by an evacuated interelectrode space 62, of the order of 1 μm. The collector has a work function which is preferably lower than that of the emitter. The device has a conductive area 41 which allows electrons to flow from the collector 22, through an electrical load 42, and back to the emitter 21. The device is housed in a transparent casing 61.

Figure 5:
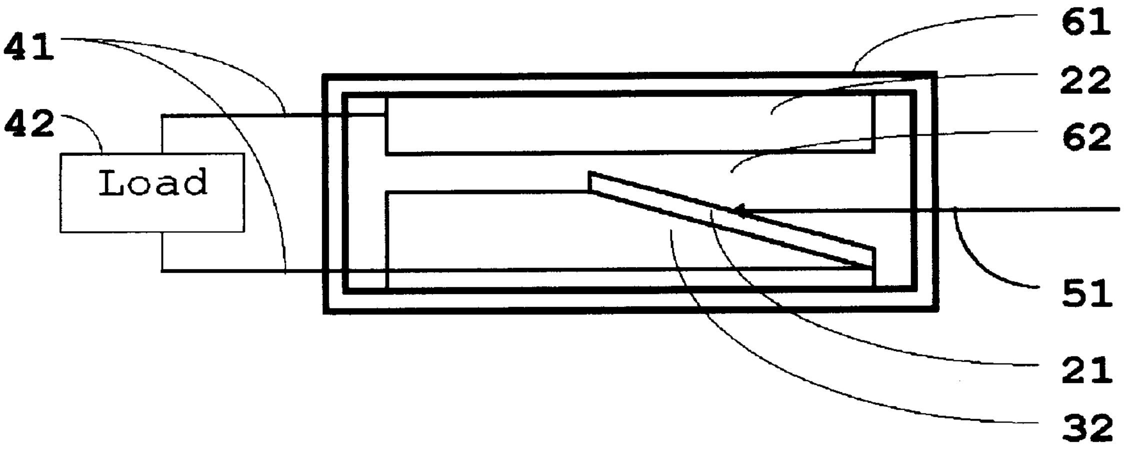

According to a still further embodiment (FIG. 5), an emitter 21 is formed on the surface of a substrate 32 having a profile which is tapered at one end. The emitter 21 is coated on the tapered end of the substrate and is a thin film of a photoelectric emitter having a work function of 1.8 eV or less, for example, bariated or thoriated tungsten. Light 51 impinges on the emitter at a low angle of incidence. Electrons are emitted as a consequence of the photoelectric effect and move to a collector 22 which is separated from the emitter 21 by an evacuated interelectrode space 62, of approximately 1 μm. The low angle of incidence of the light beam helps overcome space charge effects in the evacuated interelectrode space by exerting radiation pressure on the emitted electrons. The device has a conductive area 41 which allows electrons to flow from the collector 22, through an electrical load 41, and back to the emitter 21. The device is housed in a transparent casing 61.

The devices described above may be fabricated by micromachining and wafer bonding techniques. The following describes an embodiment of the present invention using thoriated tungsten as the electrode material. Similar approaches may be used to fabricate the other devices.

Figure 6:
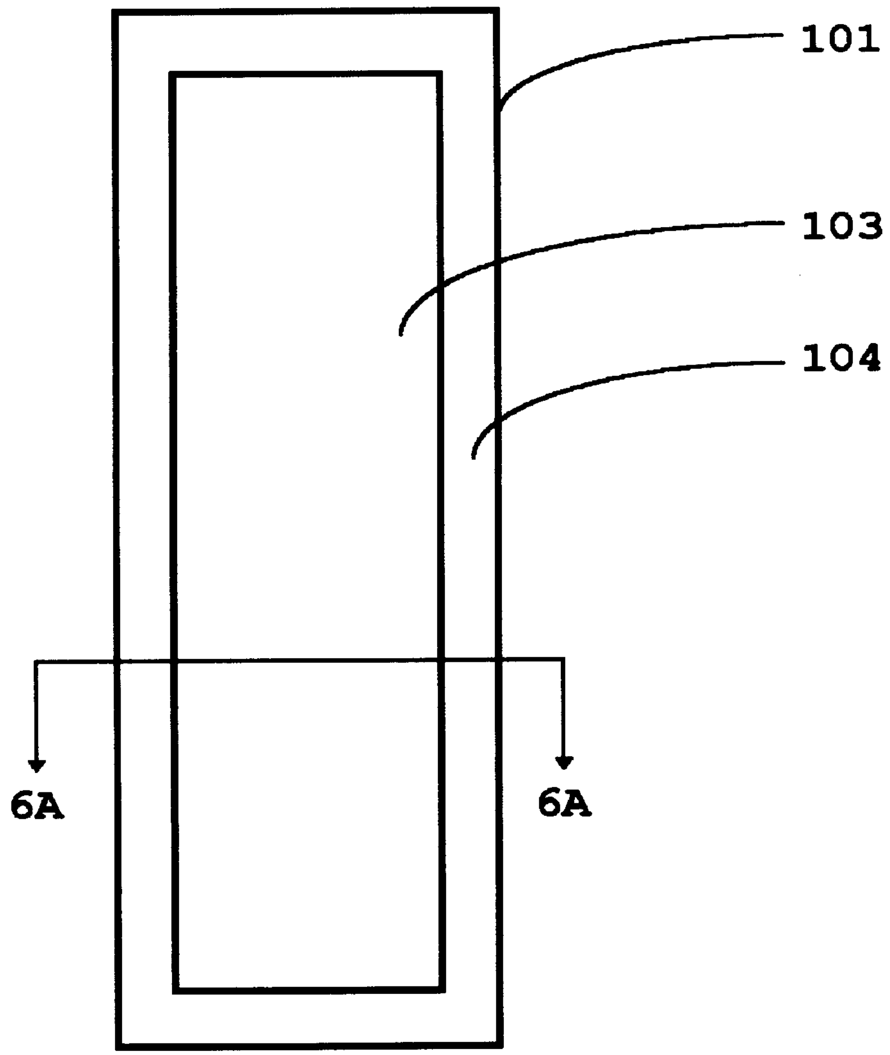
Figure 6A:
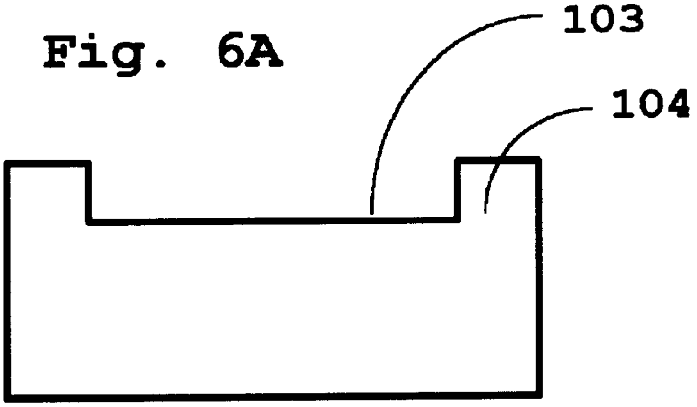

Referring to FIG. 6, a glass wafer 101 is etched with hydrofluoric acid to form a depression 103 about 0.5 μm deep on part of its surface. Depression 103 covers a long thin region in the center of wafer 101, surrounded by an edge region 104.

Figure 7:
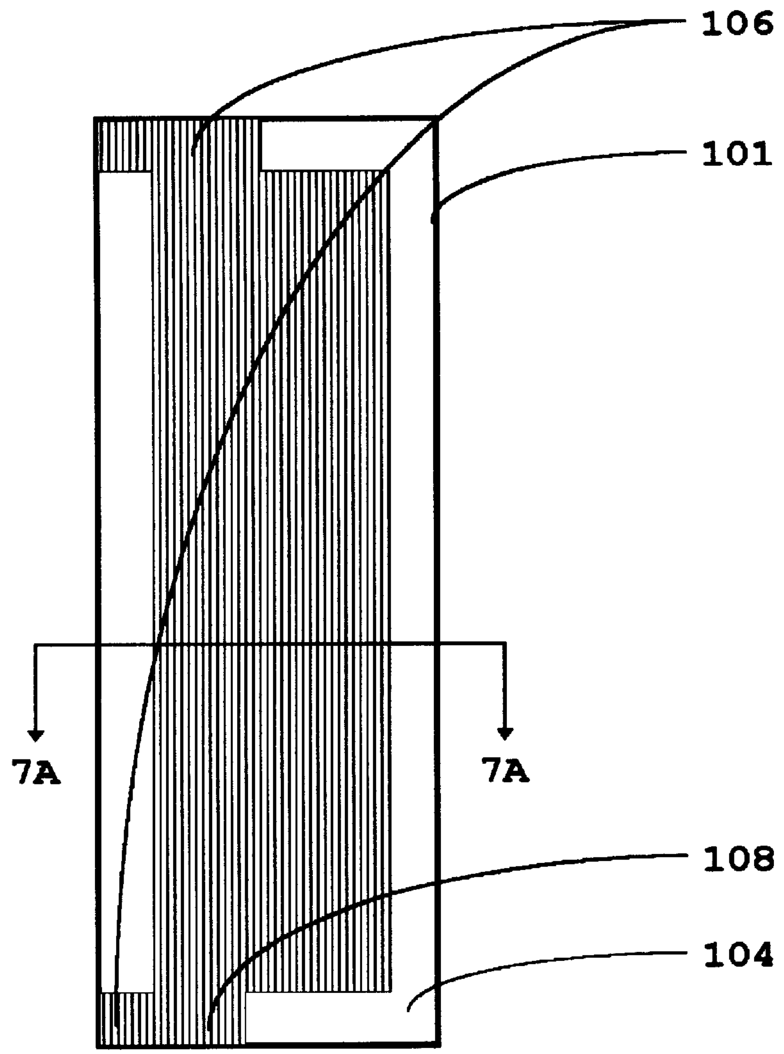
Figure 7A:
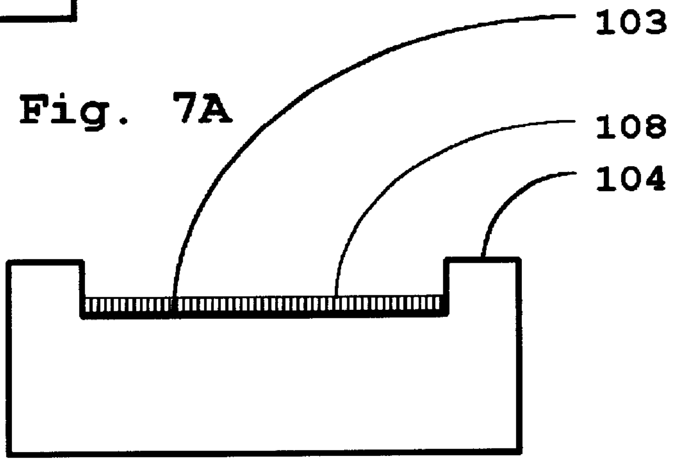

With reference to FIG. 7, means for electrical connection are formed. The floor of depression 103, and two tabs 106 on edge region 104 of wafer 101 are coated with a layer 108 of tungsten-thorium alloy, preferably by vacuum deposition, using low pressure and a non-contact mask to keep edge regions 104 clean. A second glass wafer 201 is prepared in like manner.

Figure 9:
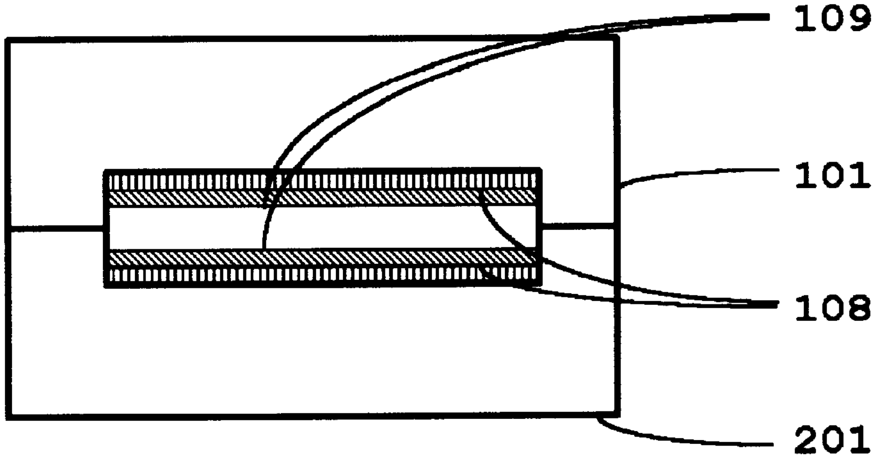

Referring now to FIG. 9, both wafers 101 and 201 are evacuated and joined together so that edge region 104 of both wafers touch. The structure is then annealed at 1000° C., which fuses the wafers together, and moves the thorium to the surface of the tungsten-thorium alloy forming two electrodes of thoriated tungsten 109. External electrical connection is made to tabs 106.

Figure 8:
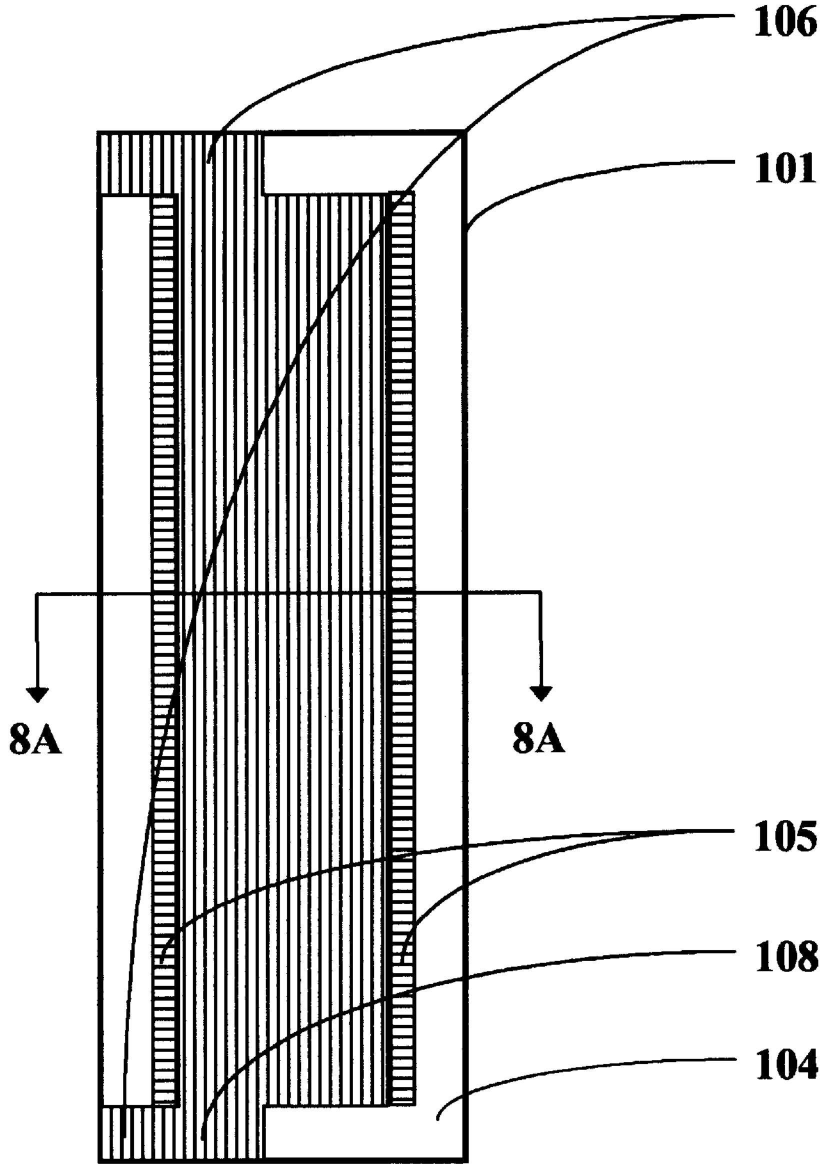
Figure 8A:
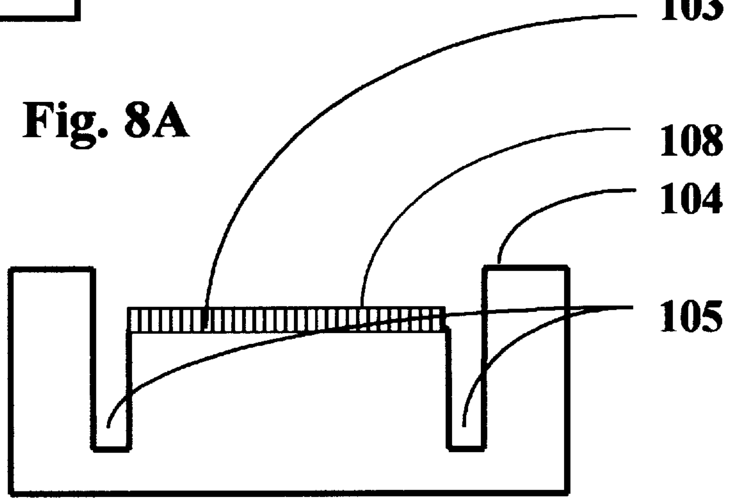
Figure 10A:
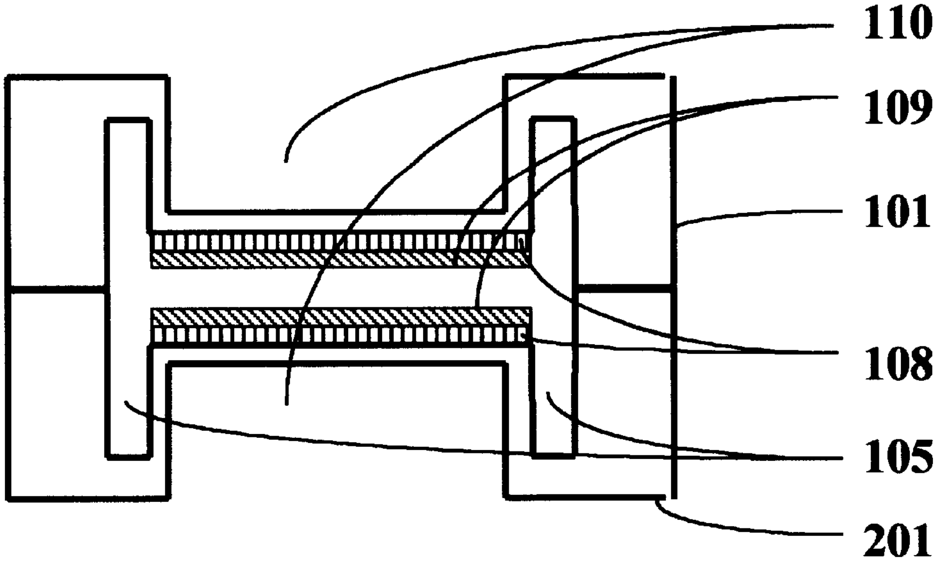
Figure 10B:
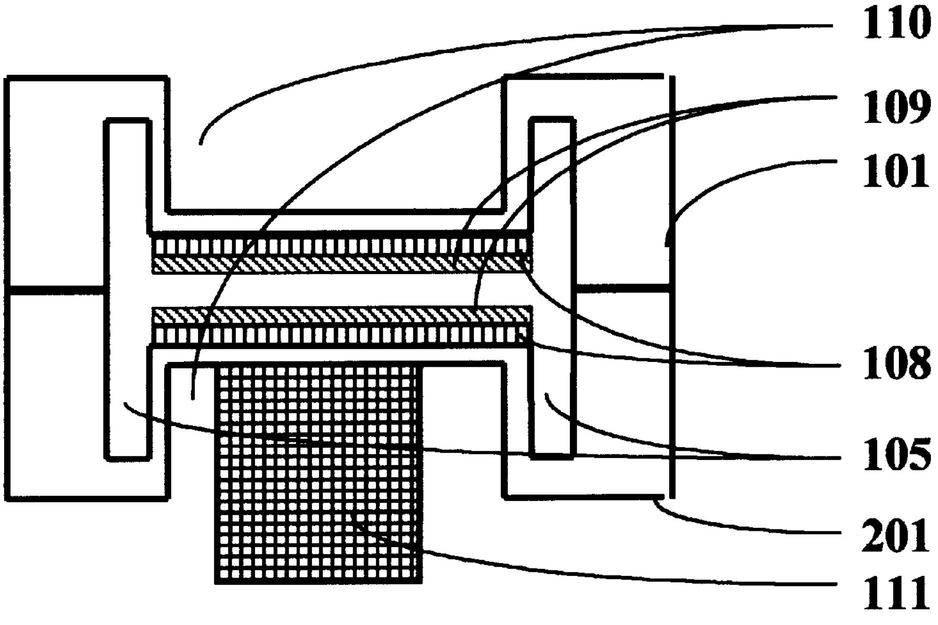
Figure 11:
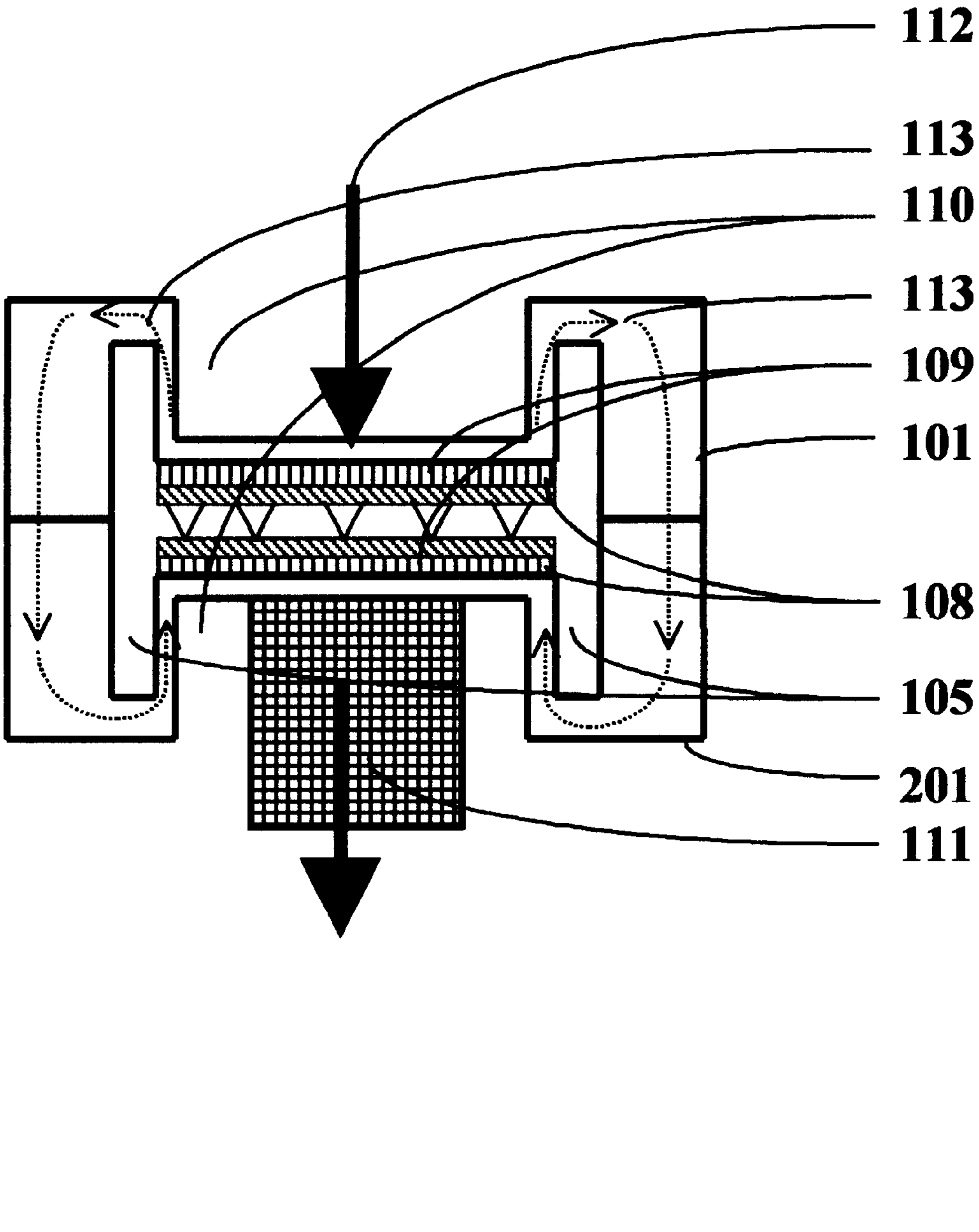
FIG. 11 illustrates the heat flows in the thermally assisted embodiment of the photoelectric device of the present invention.

With reference to FIG. 8, a thermally-assisted photoelectric converter cell having a hot emitter, before electrical contact means are introduced, two parallel saw cuts, 105 are made into the wafer 101 along two opposing edges of the depression 103. After evacuating and fusing the two wafers as described above, saw cuts 110 are also made in the back of the joined wafers 101 and 201 (see FIG. 10A) and the center of the space which is formed on wafers 201 is filled with a solder bar 111. (see FIG. 10B). The device is annealed to attach the solder and remove stress. Solder bar 111 provides thermal contact between a heat sink (not shown) and the collector to allow the cell to operate with the collector at a lower temperature than the emitter. Saw cuts 105 are provided to achieve thermal insulation between the hot side of the device and the cold side. A desired heat conduction pathway 112 (see FIG. 11) is from the surface of glass wafer 101 to the emitter, across the gap (as thermionically emitted electrons) to the collector, along the solder bar 111 to the heat sink (not shown). Undesirable heat conduction occur as heat is conducted along glass wafer 101 and around saw cut 105, across the fused junction between the wafers, and around the saw cut 105 in the other wafer, via a pathway 113 for the conduction of heat is longer than the desired heat conduction pathway 112 via the electrodes and heat losses are thereby minimized.

Figure 12A:
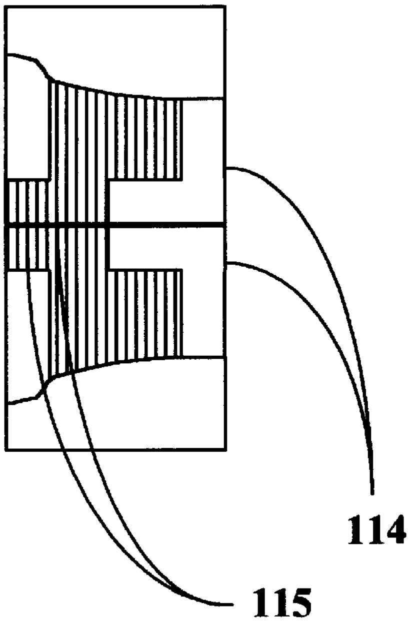
FIG. 12 illustrates embodiments of the joining of the photoelectric device of the present invention to form an array of cells.
Figure 12B:
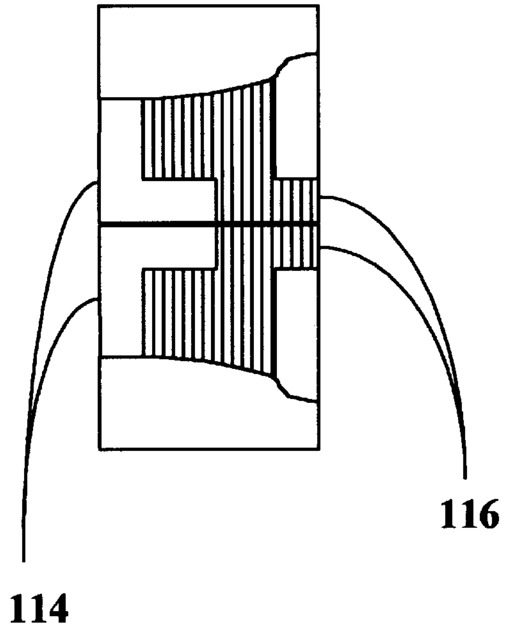
Figure 12C:
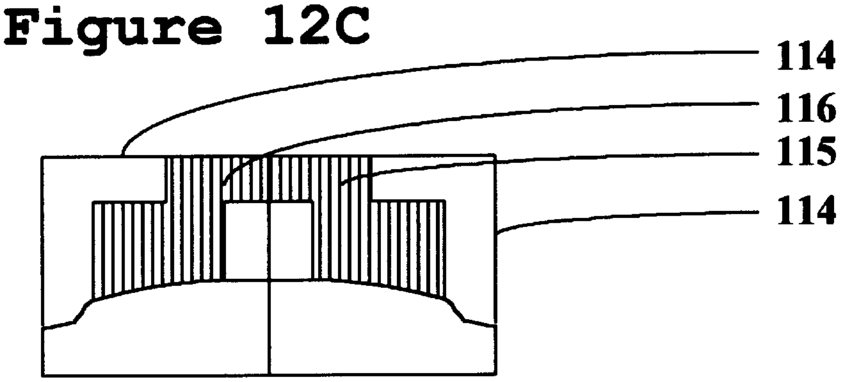
Figure 12D:
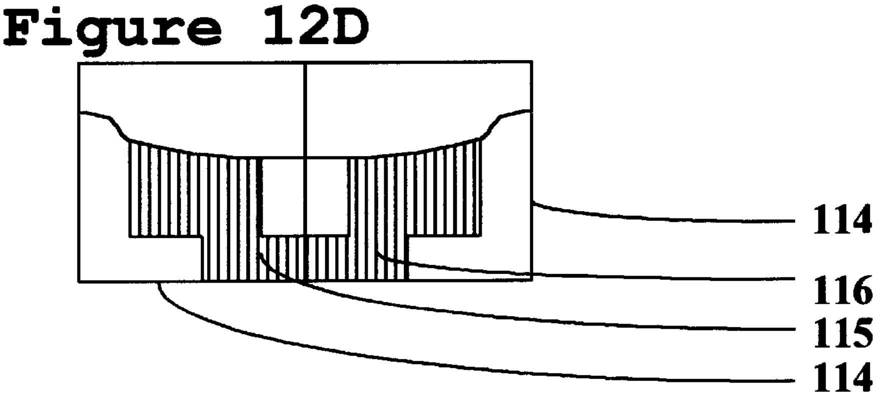

This micromachining approach provides a photoelectric converter cell. A number of these may be joined together by overlapping conductive tabs 106 (FIGS. 6–8). FIGS. 12A and 12B show how photoelectric converter cells 114 of the present invention may be joined end to end: a lower tab 115 of one cell is in electrical contact with the lower tab of the adjacent cell 115 (FIG. 12A), and upper tabs 116 are similarly in electrical contact (FIG. 12B); thereby forming an electrical parallel connection. FIGS. 12C and 12D show how photoelectric converter cells 114 of the present invention may be joined side to side: the lower tab 115 of one cell is in contact with the upper tab 116 of the adjacent cell, forming an electrical series connection. Several such cells may be fabricated upon a single substrate, thereby producing a lower current, higher voltage device.

In another preferred thermally assisted embodiment, glass wafer 101 is mounted on a thermal insulating material. When saw cuts 105 are made, these cut through the glass wafer and into the thermal insulating material. This produces a device in which undesirable heat conduction through the device are reduced: as heat is conducted along the glass wafer away from solder bars 111 and around saw cut 105, it has to pass through a thermal insulator region.

SUMMARY, RAMIFICATIONS AND SCOPE

The essence of the present invention is a photoelectric generator having close spaced electrodes. Light impinging on the emitter causes the emission of electrons, which move across this small space to the collector. They return to the emitter via an external circuit, thereby generating electricity.

Although the above specification contains many specificities, these should not be construed as limiting the scope of the invention but as merely providing illustrations of some of the presently preferred embodiments of this invention.

For example, the transparent substrate material used is not limited to glass: it may also be formed of plastics, quartz, sapphire and other transparent materials. The use of quartz glass permits light having a wavelength below about 300nm to enter the cell. In addition, different substrates may be used for each half of the device, and mixed substrates may also be used. The substrate or vacuum envelope need only be transparent in those portions which must pass light.

In the above specification a device having a thoriated tungsten emitter is described. Other materials including bariated or cesiated tungsten, cesiated silver oxide, barium oxide, and alklaide or electride materials may also be used.

The above specification uses the same material for the electrodes and for the electrical connection means. In other embodiments a different material for electrical connection may be deposited prior to deposition of the electrode material. This may be required in cases where the electrode material does not wet the substrate surface well. The conductive material may, for example, be nickel, copper, gold or silver.

Different connection means than the ones described in the above specification may also be employed.

The above specification uses wafer bonding techniques to seal the devices, but other sealing and packaging approaches may be adopted. In vacuum environments, sealing may be eliminated entirely.

Although depressions are patterned into both substrates according the specification above, a similar device may be constructed in which the depression is patterned into one surface only.

The saw-tooth converter is described only in cross section. Numerous developed versions of this cross section may be used, for example a rectangular development or a rotational development.

I claim:

1. A radiant energy to electrical power transducer for radiant energy to electrical power conversion comprising:

a) an emitter upon which said radiant energy impinges, said emitter having a work function consistent with the copious emission of electrons at the wavelengths of said radiant energy;

b) a collector to which said electrons may travel and is separated from said emitter by a space;

c) an electrical load;

d) an electrical contact by which said collector and said emitter are connected to said load; and e) a housing structured to allow said radiant energy to impinge on said emitter.

2. The radiant energy to electrical power transducer of claim 1 in which said collector is electrically more negative than said emitter.

3. The radiant energy to electrical power transducer of claim 1 in which said collector and said emitter have similar area.

4. The radiant energy to electrical power transducer of claim 1 in which said emitter is formed as a thin layer on the surface of a substrate which is transparent to said radiant energy.

5. The radiant energy to electrical power transducer of claim 4 in which said substrate has a corrugated surface comprising a series of alternating furrows each having one wall inclined at 90° to said surface and the other wall inclined at 45° to said surface and in which said wall inclined at 45° to said surface is coated with a reflective material and on which said emitter is formed as a thin layer on the surface of said reflective material.

6. The radiant energy to electrical power transducer of claim 4 in which said substrate has a corrugated surface comprising a series of alternating furrows each having one wall inclined at 90° to said surface and the other wall inclined at 45° to said surface and in which said wall inclined at 45° to said surface is coated with a thin layer of photoelectrically emissive material and in which said layer of photoelectrically emissive material is reflective oh its underside.

7. The radiant energy to electrical power transducer of claim 1 in which said collector is formed as a thin layer on the surface of a substrate which is transparent to said radiant energy.

8. The radiant energy to electrical power transducer of claim 1 in which electrons are also emitted from said emitter as a result an elevated emitter temperature.

9. The radiant energy to electrical power transducer of claim 1 in which said collector has a lower work function than said emitter.

10. The radiant energy to electrical power transducer of claim 1 in said housing is transparent to said radiant energy.

11. The radiant energy to electrical power transducer of claim 1 in which said collector has a number of holes in it which allow said radiant energy to pass through.

12. The radiant energy to electrical power transducer of claim 1 in which said emitter is formed and situated such that said radiant energy strikes it at an angle of incidence from the normal of greater than 45°.

13. The radiant energy to electrical power transducer of claim 12 in which said collector extends a substantial distance to the rear of said emitter as viewed from the direction of the incident beam of said radiant energy.

14. The radiant energy to electrical power transducer of claim 1 in which said space is substantially evacuated.

15. A radiant energy to electrical power generator comprising at least two radiant energy to electrical power transducers of claim 1 electrically connected together to form an array.

16. A radiant energy to electrical power transducer comprising:

a) a transparent micromachined first substrate having on one face a shallow depression of substantially uniform depth coated with a photoelectric emissive material and surrounded by an edge region which is thermally resistive, said photoelectric emissive material in electrical contact with an electrical contact; and b) a micromachined second substrate having on one face a shallow depression of substantially uniform depth coated with a photoelectric emissive material and surrounded by an edge region which is thermally resistive, said photoelectric emissive material in electrical contact with an electrical contact, whereby said second substrate is joined to said first substrate at their respective edge regions, and whereby said photoelectric emissive material of said first substrate is separated by a gap from said photoelectric emissive material of said second substrate.

17. The radiant energy to electrical power transducer of claim 16 in which said first substrate is a collector which is electrically more negative than said second substrate which is an emitter.

18. The radiant energy to electrical power transducer of claim 17 in which said collector and said emitter have a similar area.

19. The radiant energy to electrical power transducer of claim 17 in which said collector has a lower work function than said emitter.

20. The radiant energy to electrical power transducer of claim 16 in which said substrate material is selected from the group consisting of glass wafer, quartz wafer, fused silica wafer, plastic wafer and transparent crystalline materials.

21. A method for building a radiant energy to electrical power transducer for a radiant energy to electrical power conversion system by micromachining, comprising the steps of:

a) providing a transparent substrate with one face having a central shallow depression of substantially uniform depth;

b) forming a conductive area on the surface of said shallow depression extending to an electrical contact on the edge of said substrate;

c) forming a layer of photoelectric emissive material on the surface of said depression in electrical contact with said conductive area; and d) joining the substrate produced according to step c) with a second substrate produced according to steps a), b) and c) so that said edges of said substrate are in contact, said electrical contacts are not touching, and said coatings are separated by a gap.

* * * * *

UNITED STATES PATENT AND TRADEMARK OFFICE

CERTIFICATE OF CORRECTION

PATENT NO. : 5,973,259
DATED : October 26, 1999
INVENTOR(S) : Jonathan Sidney Edelson It is certified that error appears in the above-identified patent and that said Letters Patent is hereby corrected as shown below:

Title page,
Add ITEM [73] Assignee: BorealisTechnical Limited, London, England.

Column 9,
Line 52, change "oh" to -- on --.

Signed and Sealed this

Twenty-first Day of August, 2001

*Attest:*

Nicholas P. Godici

NICHOLAS P. GODICI

*Attesting Officer*

*Acting Director of the United States Patent and Trademark Office*